United States Patent [19]

Miller

[11] 4,200,822
[45] Apr. 29, 1980

[54] MOS CIRCUIT FOR GENERATING A SQUARE WAVE FORM

[75] Inventor: John W. V. Miller, Toledo, Ohio
[73] Assignee: Owens-Illinois, Inc., Toledo, Ohio
[21] Appl. No.: 905,620
[22] Filed: May 15, 1978
[51] Int. Cl.$^2$ .................. H04B 37/00; H05B 39/00; H05B 41/00
[52] U.S. Cl. .................. 315/169.4; 340/805; 340/811
[58] Field of Search .......... 315/169 R, 169 TV; 340/324 M; 307/227, 228, 260, 261

[56] References Cited

U.S. PATENT DOCUMENTS

| | | | |
|---|---|---|---|
| 3,821,596 | 6/1974 | Leuck | 315/169 TV |
| 4,070,600 | 1/1978 | Butler et al. | 315/169 TV |
| 4,072,937 | 2/1978 | Chu | 340/324 M |

Primary Examiner—Alfred E. Smith
Assistant Examiner—Robert E. Wise
Attorney, Agent, or Firm—D. H. Wilson; M. E. Click

[57] ABSTRACT

A circuit for generating a square wave form which circuit comprises two MOSFETs and is driven by only one control logic signal. A first MOSFET is connected between a ground potential power supply and the circuit output line while a second MOSFET is connected between the circuit output line and a positive potential power supply. The gate of the second MOSFET is connected to the source of the first MOSFET which has a gate connected to receive the control logic signal. When the logic signal is at a high level, the first MOSFET is turned on and the gate of the second MOSFET is pulled down to ground potential such that the second MOSFET is turned off. Thus, the circuit output line will be near the ground potential. When the logic signal switches to a low level, the first MOSFET is turned off and the voltage across a capacitor which has been charged by a power supply causes the second MOSFET to turn on such that the circuit output line will be near the positive potential. This circuit is typically used to drive capacitive type loads such as those found in gas discharge display devices.

10 Claims, 5 Drawing Figures

MOS CIRCUIT FOR GENERATING A SQUARE WAVE FORM

BACKGROUND OF THE INVENTION

1. Field of the Invention

This invention relates to circuits for controlling gas discharge devices, especially multiple gas discharge display/memory devices which have an electrical memory and which are capable of producing a visual display or representation of data.

2. Description of the Prior Art

Heretofore, multiple gas discharge display and/or memory panels have been proposed in the form of a pair of dielectric charge storage members which are backed by electrodes, the electrodes being so formed and oriented with respect to an ionizable gaseous medium as to define a plurality of discrete gas discharge units or cells. The cells have been defined by a surrounding or confining physical structure such as the walls of apertures in a perforated glass plate sandwiched between glass surfaces and they have been defined in an open space between glass or other dielectric backed with conductive electrode surfaces by appropriate choices of the gaseous medium, its pressure and the electrode geometry. In either structure, charges (electrons and ions) produced upon ionization of the gas volume of a selected discharge cell, when proper alternating operating voltages are applied between the opposed electrodes, are collected upon the surface of the dielectric at specifically defined locations. These charges constitute an electrical field opposing the electrical field which created them so as to reduce the voltage and terminate the discharge for the remainder of the cycle portion during which the discharge producing polarity remains applied. These collected charges aid an applied voltage of the polarity opposite that which created them in the initiation of a discharge by imposing a total voltage across the gas sufficient to again initiate a discharge and a collection of charges. This repetitive and alternating charge collection and ionization discharge constitutes an electrical memory.

In the operation of the display/memory device, an alternating voltage is applied, typically, by applying a first periodic voltage wave form to one array and applying a cooperating second wave form, frequently identical to and shifted on the time axis with respect to the first wave form, to the opposed array to impose a voltage across the cells formed by the opposed arrays of electrodes which is the algebraic sum of the first and second wave forms. The cells have a voltage at which a discharge is initiated. That voltage can be derived from an externally applied voltage or a combination of wall charge potential and an externally applied voltage. Ordinarily, the entire cell array is excited by an alternating voltage which, by itself, is of insufficient magnitude to ignite gas discharges in any of the elements. When the walls are appropriately charged, as by means of a previous discharge, the voltage applied across the element will be augmented, and a new discharge will be ignited. Electrons and ions again flow to the dielectric walls extinguishing the discharge. However, on the following half cycle, their resultant wall charges again augment the applied external voltage and cause a discharge in the opposite direction. The sequence of electrical discharges is sustained by an alternating voltage signal that, by itself, could not initiate that sequence.

In addition to the sustaining voltage, there are manipulating voltages or addressing voltages imposed on the opposed electrodes of a selected cell or cells to alter the state of those cells selectively. One such voltage, termed a "writing voltage", transfers a cell or discharge site from the quiescent to the discharging state by virtue of a total applied voltage across the cell sufficient to make it probable that on subsequent sustaining voltage half cycles the cell will be in the "on state". A cell in the "on state" can be manipulated by an addressing voltage, termed an "erase voltage", which transfers it to the "off state" by imposing sufficient voltage to draw off the surface or wall charges on the cell walls and cause them to discharge without being collected on the opposite cell walls in an amount such that succeeding sustainer voltage transitions are not augmented sufficiently by wall charges to ignite discharges.

Typical prior art sustainer circuits are disclosed in U.S. Pat. No. 3,777,182 issued to E. F. Peters and entitled "Transistor Control Apparatus"; U.S. Pat. No. 3,777,183 issued to E. F. Peters and entitled "Transistor Control Apparatus"; U.S. Pat. No. 3,821,599 issued to E. F. Peters and entitled "Transistor Control Apparatus"; and U.S. Pat. No. 3,859,560 issued to E. F. Peters and entitled "Multivoltage Level Plasma Display Panel Sustainer Circuits".

SUMMARY OF THE INVENTION

The present invention concerns a low impedance driving circuit for generating a wave form which can be utilized as the sustaining voltage in a gas discharge display device. The circuit comprises two MOSFETs and is driven by only one control logic signal. A first MOSFET is connected between a ground potential power supply and the circuit output line while a second MOSFET is connected between the circuit output line and a positive potential power supply. A third power supply is connected to the gate of the second MOSFET through a first diode and a resistor. A capacitor has one terminal connected to the circuit output line and the other terminal connected between the resistor and the first diode. A second diode has an anode connected to the circuit output line and a cathode connected to the source of the first MOSFET which in turn is connected to the gate of the second MOSFET.

The gate of the first MOSFET is connected to receive the control logic signal. When the logic signal is high, the first MOSFET is turned on and the gate of the second MOSFET and the signal on the circuit output line will be near the potential of the ground potential power supply. Hence, when the first MOSFET is in the on state, the second MOSFET will be turned off. When the logic signal switches to the low level, the first MOSFET will turn off. At this time, the capacitor, which has been charged by the third power supply through the first diode, applies its voltage at the gate of the second MOSFET turns on. Thus, the signal on the circuit output line will be near the positive potential.

It is an object of the present invention to generate a square wave form which is capable of driving capacitive type load such as the circuits in a gas discharge display device.

It is another object of the present invention to simplify the sustainer circuitry in a gas discharge display device.

DESCRIPTION OF THE PREFERRED EMBODIMENT

Figure 1:
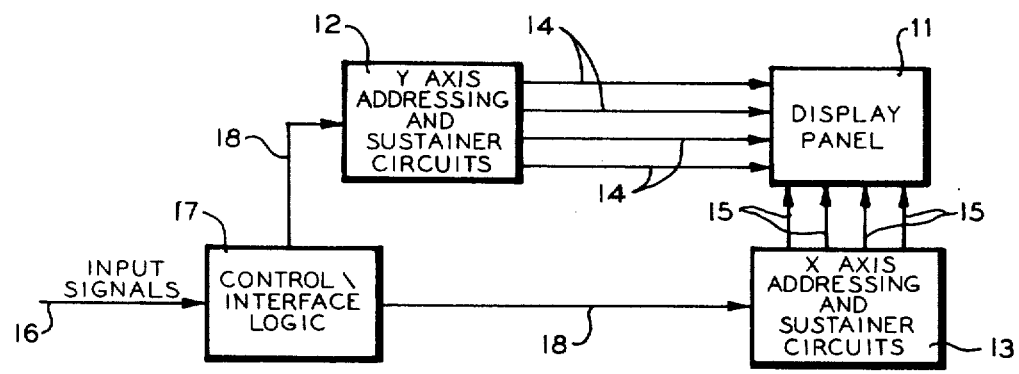
FIG. 1 is a block diagram of a multicelled gas discharge display/memory device and operating system therefor.

There is shown in FIG. 1 a block diagram of a multicelled gas discharge display/memory device and operating system therefor to which the present invention is applicable. The device is represented as a display panel 11 which can be of the type disclosed in U.S. Pat. No. 3,499,167 issued to Theodore C. Baker, et al. The panel 11 includes a pair of opposed electrode arrays (not shown) with proximate electrode portions of at least one electrode in each array defining the cells. The addressing and sustainer wave forms are generated by a pair of addressing and sustainer circuits, a Y axis circuit 12 and an X axis circuit 13, which are connected to the Y axis and X axis electrode arrays respectively. A plurality of leads 14 are representative of the interconnections between the Y axis circuit 12 and the Y axis electrodes (not shown) of the panel 11 and a plurality of leads 15 are representative of similar interconnections on the X axis. The information to be displayed by the panel 11 is externally generated and applied as input signals on one or more input lines 16 to a control and interface logic circuit 17. The circuit 17 buffers and decodes the input signals to generate control signals on lines 18 to the circuits 12 and 13.

Figure 2:
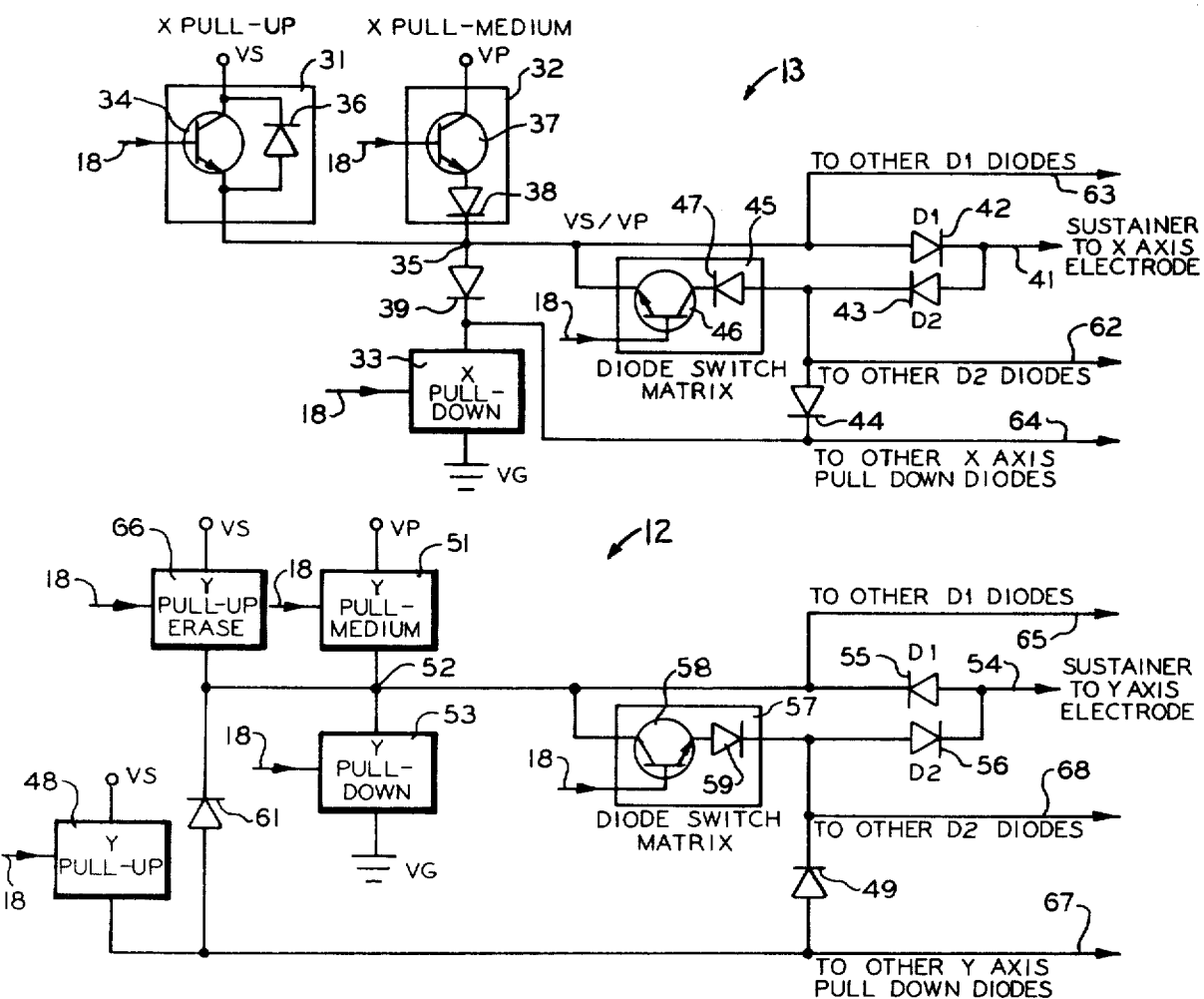
FIG. 2 is a schematic diagram of a prior art sustainer circuit.
Figure 3:
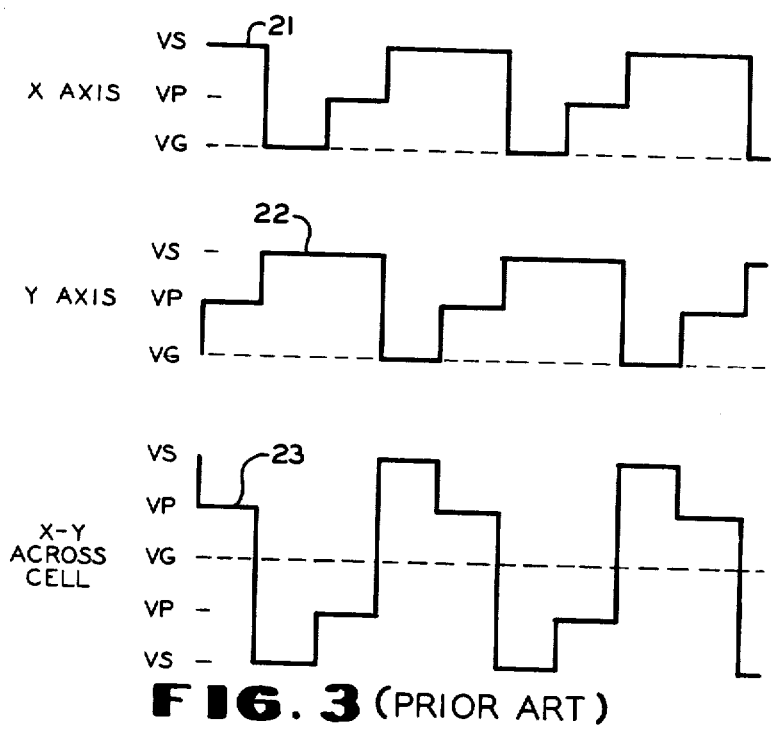
FIG. 3 is a wave form diagram of a typical prior art sustainer wave form.

FIG. 2 is a partial schematic, partial block diagram of a portion of circuits similar to each of the circuits 12 and 13 in a prior art configuration for generating addressing and sustainer wave forms such as the wave forms shown in FIG. 3. During the normal sustainer operation, X and Y sustainer circuits impress sustainer wave forms on the X and Y electrode arrays respectively. As shown in FIG. 3, an X axis sustainer wave form 21 and a Y axis sustainer wave form 22 are combined to generate a composite sustainer wave form 23 which is applied to all of the cells is the panel 11. The X axis sustainer circuit includes three sustainer voltage circuits, an X pull-up circuit 31, an X pull-medium circuit 32 and an X pull-down circuit 33 for generating the X sustainer wave form 21. The X pull-up circuit 31 is connected to a sustainer voltage power supply (not shown) to receive a sustainer voltage VS. The circuit 31 is represented as an NPN transistor 34 having a collector connected to the VS power supply, a base connected to receive control signals from the control/interface logic circuit 17 of FIG. 1 and an emitter connected to a common junction 35 for the circuits 31, 32 and 33. A diode 36 has a cathode connected to the collector and an anode connected to the emitter of the transistor 34 to function as a diode clamp.

The X pull-medium circuit 32 is connected to a sustainer power supply (not shown) to receive a pedestal voltage VP of a magnitude intermediate the voltage VS and the voltage applied by the X pull-down circuit 33. The circuit 32 is represented by an NPN transistor 37 having a collector connected to the VP power supply, a base connected to receive control signals from the circuit 17 of FIG. 1 and an emitter connected to an anode of a diode 38 having a cathode connected to the common junction 35 for the circuits 31, 32 and 33. The X pull-down circuit 33 is connected to a sustainer power supply (not shown) to receive a ground voltage VG which is the neutral potential for the sustainer wave form. The circuit 33 is similar in configuration to the circuit 31 and is connected to receive control signals from the circuit 17 of FIG. 1. A diode 39 is connected between the circuit 33 and the common junction 35 with an anode connected to the common junction and a cathode connected to the collector of the transistor (not shown) in the circuit 33.

In FIG. 2, each electrode is connected to its own pair of isolation diodes designated D1 and D2. These diodes are oppositely poled to provide low impedance paths for the sustainer current flow and to isolate each electrode from the other electrodes in the panel during addressing.

The circuits 31, 32 and 33 are connected to an X axis lead 41 through a D1 diode 42 and a D2 diode 43. The D1 diode 42 has an anode connected to the common junction 35 and a cathode connected to the lead 41. The lead 41 can be a conductor on a flexible ribbon cable having one end connected to the addressing and sustainer circuits and the other end connected to an exposed end of an electrode (not shown) of the panel, where the circuits are mounted remote from the panel, or can be the exposed end of the electrode where the circuits are mounted on the panel substrate surrounding the actual viewing area. The circuit 33 is connected to a cathode of a diode 44 having an anode connected to a cathode of the D2 diode 43 which has an anode connected to the lead 41. The sustainer circuits are individually enabled by the control signals to generate the X axis wave form 21 shown in FIG. 3 on the lead 41 through the D1 diode 42 and the D2 diode 43. The sustainer circuits are also connected to the other X axis electrodes as will be discussed.

The D2 diode 43 has its cathode connected to one lead of a diode switch matrix 45. Another lead of the matrix 45 is connected to the common junction 35. A portion of the matrix 45 is represented as a transistor switch which is one of a plurality of such switches. An NPN transistor 46 has a collector connected to a cathode of a diode 47, a base connected to receive control signals from the circuit 17 of FIG. 1 and an emitter connected to the common junction 35. The diode 47 has an anode connected to the anode of the diode 44. The diode switch matrix 45 and a similar matrix for the Y axis also serve as multiplexing circuits for addressing the cells as will be subsequently discussed.

The Y axis also has sustainer circuits similar to the circuits 31, 32 and 33, such as a Y pull-up circuit 48 connected between the VS power supply (not shown) and a diode 49, a Y pull-medium circuit 51 connected between the VP power supply (not shown) and a common junction 52 and a Y pull-down circuit 53 connected between the VG power supply (not shown) and the common junction 52. The circuits 48, 51 and 53 are connected to a Y axis lead 54, similar to the X axis lead 41, through a D1 diode 55 and a D2 diode 56. The D1 diode 55 has a cathode connected to the common junction 52 and an anode connected to the lead 54. The circuit 48 is connected to an anode of the diode 49 which has a cathode connected to an anode of the D2 diode 56 which has a cathode connected to the lead 54. The lead 54 is connected to an electrode (not shown) wherein the circuits are alternately enabled by control signals from the circuits 17 of FIG. 1 to generate the Y axis wave form 22 shown in FIG. 3 through the D1 diode 55 and the D2 diode 56. The sustainer circuits are also connected to all of the other Y axis electrodes, as will be discussed, to apply the Y axis sustainer wave form 22 to the Y axis electrode array.

The D2 diode 56 has its anode connected to one lead of a diode switch matrix 57. Another lead of the matrix 57 is connected to the common junction 52. A portion of the matrix is represented as a transistor switch which is one of a plurality of such switches. An NPN transistor 58 has a collector connected to the junction 52, a base connected to receive control signals from the circuit 17 of FIG. 1 and an emitter connected to an anode of a diode 59. The diode 59 has a cathode connected to the anode of the D2 diode 56. The circuit 48 is also connected to the junction 52 through a diode 61 having an anode connected to the circuit 48 and a cathode connected to the junction 52.

Assuming the initial conditions shown in FIG. 3, the X pull-up circuit 31 is turned on to apply the VS voltage to the X axis electrode through the D1 diode 42 and the Y pull-down circuit 53 is turned on to apply the VG voltage to the Y axis electrode through the D1 diode 55. Next, the circuit 53 is turned off and the Y pull-medium circuit 51 and the matrix 57 are turned on to connect the VP voltage to the Y axis electrode through the D2 diode 56. Since the Y axis electrode was at the VG voltage, the charge across the cell defined by the X and Y axis electrodes must decrease which it cannot do instantaneously. The voltage on the X axis electrode is driven to VS+VP to reverse bias the diode 42. Therefore, the matrix 45 is turned on to provide a path for the displacement current which flows from the X axis electrode, through the diode 43, through the matrix 45 and through the diode 36 to the VS power supply to partially discharge the cell to the new applied voltage VP as shown in FIG. 3.

Next, the X pull-down circuit 33 is turned on to connect the VG voltage to the X axis electrode through the D2 diode 43 and the diode 44. The D1 diode 42 is biased at VG by the circuit 33 through the diode 39. The Y pull-up circuit 48 is turned on to connect the VS voltage to the Y axis electrode through the D2 diode 56 and the diode 49. Next, displacement current flows through the diode 38 as the circuit 32 is turned on to connect the VP voltage to the X axis electrode through the D1 diode 42 and the circuit 48 is turned on to connect the VS voltage to the Y axis electrode. Then, the X pull-up circuit 31 is turned on to connect the VS voltage to the X axis electrode through the D1 diode 42 and the Y pull-down circuit 53 is turned on to connect the VG voltage to the Y axis electrode through the D1 diode 55. Thus, a full cycle of the sustainer wave form 23 has been generated and the sequence of control signals is repeated to generate a train of such cycles.

Where the X and Y electrode arrays each include a large number of electrodes, some of the prior art circuits have utilized a multiplexing approach to addressing the cells. For example, both electrode arrays can be divided into groups of electrodes, each group containing the same number of electrodes. One portion of the multiplexing circuit is the D2 diode 43 and the matrix 45. The matrix 45 is connected to a D2 diode for each of the electrodes in one X axis group by a line 62. Each of the other groups is also provided with similar diode switches for multiplexing. When a resistor pulser (not shown) connected to the D1 diodes is turned on, the matrix 45 is turned off and all other switches remain turned on such that addressing voltage is dropped across each of the resistors connected to the resistor pulser except the resistor associated with the matrix 45 such that only the electrode connected to the lead 41 receives the addressing voltage. The Y axis electrodes are similarly connected in groups.

The sustainer wave forms are also applied to the other electrodes. The circuits 31 and 32 are connected to all of the X axis D1 diodes by a line 63. The circuit 33 is connected to all the D2 diodes through a pull-down diode for each group of electrodes similar to the pull-down diode 44. A line 64 connects the circuit 33 to the other X axis pull-down diodes. The circuit 53 is connected to all of the Y axis D1 diodes by a line 65. The circuit 51 and a Y pull-up erase circuit 66 are connected to all of the D2 diodes through diode switches such as the matrix 57. The circuit 48 is connected through a line 67 to all of the D2 diodes through a pull-up diode for each group of electrodes similar to the pull-up diode 49. The Y pull-up erase circuit is utilized during "erase" addressing to supply the VS voltage to the Y axis electrodes since the Y pull-up circuit 48 is isolated by several diodes (not shown). The matrix 57 is connected to all other D2 diodes by a line 68.

Figure 4:
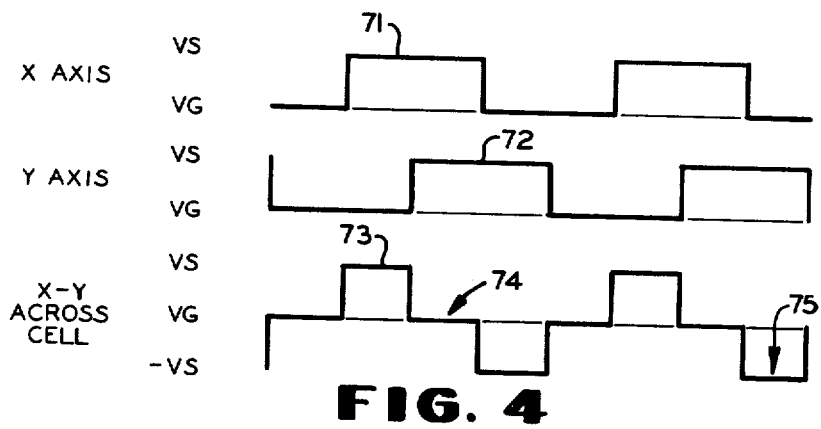
FIG. 4 is a wave form diagram of a sustainer wave form generated by a sustainer circuit according to the present invention.

Addressing systems have typically utilized floating power supplies to generate the addressing voltage pulses for turning on and off the panel cells. This type of addressing was dictated by the maximum voltage limitations of the addressing circuit elements. Thus, the prior art sustainer wave form included a pedestal voltage portion, VP in FIG. 3, from which the addressing voltages were referenced. However, recent developments in high voltage MOSFET design have made it possible to address with reference to the ground potential VG and thus eliminate the pedestal. Such a system is disclosed in the previously referenced U.S. patent application Ser. No. 825,291. There is shown in FIG. 4 a sustainer wave form for use with ground referenced addressing. During the operation of the panel 11, the X and Y sustainer circuits impress the sustainer voltages on the X and Y electrode arrays respectively. As shown in FIG. 4, an X axis sustainer wave form 71 is generated with a magnitude which alternates between a maximum sustainer potential VS and a minimum potential VG which can be ground potential. A Y axis wave form 72 is generated in a similar manner and the wave forms are combined across the panel cells to generate a composite sustainer wave form 73 having a magnitude equal to the sum of the magnitudes of the wave forms 71 and 72. Typically, a ground referenced "write" pulse is generated in the area 74 of the composite sustainer to turn on a cell and an "erase" pulse is generated in the −VS area 75 to turn off a cell.

Figure 5:
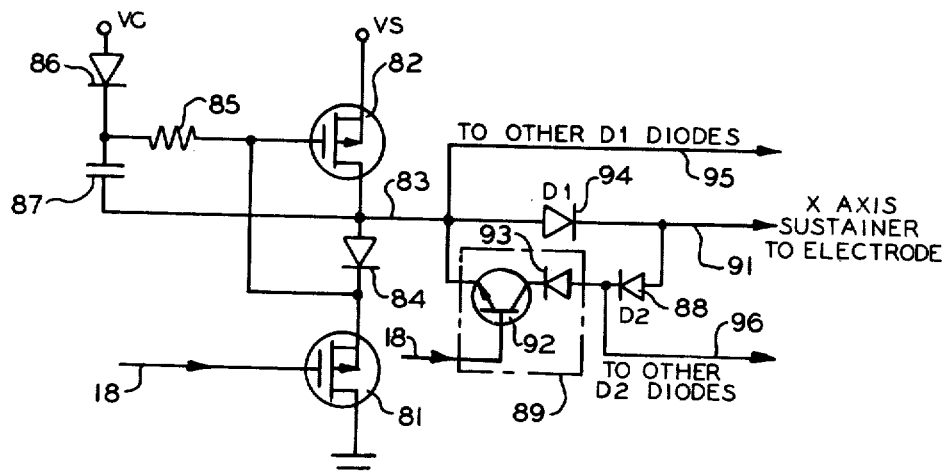
FIG. 5 is a schematic diagram of a sustainer circuit according to the present invention.

There is shown in FIG. 5 a schematic diagram of a sustainer circuit according to the present invention which can be utilized to generate the X axis wave form 71 and the Y axis wave form 72 of FIG. 4. A metal-oxide semiconductor field effect transistor (MOSFET) 81 has a gate connected to a line 18 to receive a logic input signal from the control and interface logic circuit 17 of FIG. 1. The MOSFET 81 has a source connected to a gate of a MOSFET 82 and a drain connected to the system ground potential VG. The MOSFET 82 has a source connected to a positive power supply VS (not shown) and a drain connected to a circuit output line 83. As will be discussed, the sustainer output signal is generated on a line 83 which is connected to the appropriate electrodes on the display panel.

A diode 84 has an anode connected to the drain of the MOSFET 82 and a cathode connected to the source of the MOSFET 81. A resistor 85 is connected between the drain of the MOSFET 82 and the cathode of a diode 86 having an anode connected to a positive power supply VC (not shown). A capacitor 87 has one side connected to the junction between the resistor 85 and the diode 86 and the other side connected to the output line 83.

The circuit of FIG. 5 requires only one control logic signal for operation. The potential VS is chosen to equal the desired maximum sustainer potential while the potential VC is typically chosen to equal the high level of the logic input signal on the line 18. Since gas discharge display devices typically require relatively high sustainer voltages for succcessful operation, the MOSFETs 81 and 82 are typically V MOS or D MOS power devices which are capable of handling the high sustainer currents at a low output impedance. V MOS devices are fabricated with a V-shaped gate to create a vertical current flow having a much higher current density than can be obtained using conventional MOSFETs which are fabricated laterally in a planar format. The V MOS structure improves switching speed, linearity, breakdown voltage and drain-source resistance characteristics over a conventional MOSFET. Moreover, the V MOS devices have advantages over bipolar devices in that they are not limited by minority-carrier storage time. For example, VMP-1 power MOSFETs manufactured by Siliconix can be used as the MOSFETs 81 and 82.

When the input signal on the line 18 is at a high level, the MOSFET 81 will be in the on state and its source will be near the ground potential VG. The gate of the MOSFET 82 will also be near the ground potential VG and thus the MOSFET 82 will be in the off state. The sustainer output line 83 will be at a potential which is slightly above the ground potential VG by an amount determined by the forward voltage drop across the diode 84 and the voltage drop across the MOSFET 81. The capacitor 87 is charged by the VC power supply through the diodes 86 and 84 and the MOSFET 81 and the voltage drop across the capacitor 87 and the diode 84 appears across the resistor 85. Thus, the VG portion of the sustainer wave form on either axis is generated. In FIG. 5 there is shown a diode isolation circuit for the X axis including a D2 diode 88 having a cathode connected to the line 83 through a diode switch 89 and an anode connected to a lead 91 connected in turn to an X axis electrode (not shown). The diode switch 89 includes an NPN transistor 92 having an emitter connected to the line 83, a collector connected to the cathode of a diode 93 and a base connected to receive control signals on the line 18. The anode of the diode 93 is connected to the cathode of the D2 diode 88 to prevent reverse biasing of the transistor 92. The diode switch 89 is normally in the on state except when it is desired to apply an address pulse to an X axis electrode.

When the input signal on the line 18 is switched to a low level, the MOSFET 81 is turned off. Now the capacitor 87, which charged to the VC potential less two diode drops, applies its voltage to the gate of the MOSFET 82 to turn it on. Thus, the VS portion of the sustainer wave form on either axis is generated. Again in FIG. 5, a D1 diode 94 has a cathode connected to the line 83 and an anode connected to the lead 91. The sustainer output line 83 is also connected to other D1 diodes by a line 95 and to other D2 diodes by a line 96. It should be noted that, if the multiplexed addressing approach previously described for FIG. 2 is utilized, a separate diode switch is provided for each group of X axis electrodes. However, in an addressing approach which utilizes a separate active switch such as a MOSFET connected in parallel with each D2 diode, only a single diode switch is required for the X axis electrodes.

In summary, the present invention concerns a circuit for generating a square wave alternating between first and second voltages. Typically, the circuit is utilized to generate a sustainer wave form of alternating positive and ground potential voltages to at least one electrode array of a gas discharge display/memory device. A first switching means such as an FET is connected between the voltage source and an output line to the electrode array. This first FET is responsive to a first state of a two state control signal for connecting the voltage source to the output line to apply a first voltage or ground potential and is responsive to the second state of the control signal for disconnecting the voltage source. A second switching means such as an FET is also connected between the voltage source and the output line. This second FET is responsive to an enable signal for connecting the voltage source to the output line to apply a second voltage or positive potential to the output line and is responsive to the ground potential on the output line for disconnecting the voltage source from the output line. The enable signal can be generated by a capacitor charged from a voltage source.

In accordance with the provisions of the patent statutes, the principle and mode of operation of the invention have been explained in its preferred embodiment. However, it must be understood that the invention may be practiced otherwise than as specifically illustrated and described without departing from its spirit or scope.

What is claimed is:

1. A circuit for generating a square wave alternating between first and second voltages on an output line comprising:
   a source of the first and second voltages;
   a source of a two state control signal;
   a first switching means responsive to one state of said control signal for connecting said voltage source to the output line to apply the first voltage to the output line and responsive to the other state of said control signal for disconnecting said voltage source from the output line;
   a source of an enable signal; and
   a second switching means responsive to said enable signal for connecting said voltage source to the output line to apply the second voltage to the output line and responsive to the application of the first voltage to the output line for disconnecting said voltage source from the output line.

2. A circuit according to claim 1 wherein said first and second switching means are field effect transistors and said enable signal source is a charged capacitor.

3. A circuit for generating a sustainer wave form alternating between first and second voltage potentials in a gas discharge display/memory device, the device including a display memory panel having at least one electrode array to which the sustainer wave form is to be applied, a power supply for generating the first and second voltage potentials, and a source of control signals, the circuit comprising:
- a first switch means responsive to one of the control signals for connecting the power supply to the one electrode array to apply the first potential and responsive to another one of the control signals for disconnecting the power supply from the one electrode array;
- a source of an enable signal; and
- a second switch means responsive to said enable signal for connecting the power supply to the one electrode array to apply the second potential and responsive to the application of the first potential to the one electrode array for disconnecting the power supply.

4. A circuit according to claim 3 wherein said one control signal and said another control signal are the two states of a bistable control signal.

5. A circuit according to claim 3 wherein said first and second switching means are field effect transistors.

6. A circuit according to claim 3 wherein said first and second switching means each have an input terminal, an output terminal and a control terminal; wherein said first switching means has said input terminal connected to the one electrode array, said output terminal connected to the power supply and said control terminal connected to the control signals source; and wherein said second switching means has said input terminal connected to the power supply, said output terminal connected to the one electrode array and said control terminal connected to said enable signal source and said first switching means input terminal.

7. A circuit according to claim 3 wherein the first voltage potential is ground potential and the second voltage potential is the maximum sustainer wave form potential.

8. A sustainer circuit for generating a wave form alternating between first and second voltages is a gas discharge display/memory device, the device including a display/memory panel having at least one electrode array to which a sustainer wave form is to be applied, a power supply for generating the first and second voltages, and a source of a two state control signal, the circuit comprising:
- a first switching means connected between the power supply and the one electrode array and being responsive to a first state of the control signal for connecting the power supply to the one electrode array to apply the first voltage and being responsive to a second state of the control signal for disconnecting the power supply from the one electrode array; and
- a second switching means connecting the power supply to the one electrode array to apply the second voltage and being responsive to the application of the first voltage to the one electrode array for disconnecting the power supply from the one electrode array.

9. A circuit according to claim 8 wherein said second switching means includes a source of an enable signal and means responsive to said enable signal for connecting the power supply to the one electrode array.

10. A circuit according to claim 9 wherein said first switching means includes a field effect transistor having a source connected to the one electrode array, a drain connected to the power supply and a gate connected to the control signal source; and said enable signal responsive means includes a field effect transistor having a source connected to the power supply; a drain connected to the one electrode array and a gate connected to said enable signal source and the source of said first switching means field effect transistor.

* * * * *